United States Patent
Kister

(10) Patent No.: US 6,570,396 B1
(45) Date of Patent: May 27, 2003

(54) INTERFACE STRUCTURE FOR CONTACTING PROBE BEAMS

(75) Inventor: January Kister, Redwood City, CA (US)

(73) Assignee: Kulicke & Soffa Investment, Inc., Wilmington, DE (US)

(*) Notice: Subject to any disclaimer, the term of this patent is extended or adjusted under 35 U.S.C. 154(b) by 0 days.

(21) Appl. No.: 09/721,910

(22) Filed: Nov. 24, 2000

(51) Int. Cl.$^7$ ................................................ G01R 31/02
(52) U.S. Cl. ........................................ 324/754; 257/779
(58) Field of Search .............................. 324/72.5, 754, 324/755, 765; 257/779, 780, 781, 734, 737; 438/613–617; 29/840, 843

(56) References Cited

U.S. PATENT DOCUMENTS

| | | | |
|---|---|---|---|
| 4,622,514 A | 11/1986 | Lewis | 324/158 |
| 4,816,754 A | 3/1989 | Buechele et al. | 324/158 |
| 4,932,883 A | 6/1990 | Hsia et al. | 439/66 |
| 5,937,320 A | * 8/1999 | Andricacos et al. | 438/612 |
| 5,977,632 A | * 11/1999 | Beddingfield | 257/734 |
| 6,107,180 A | * 8/2000 | Munroe et al. | 29/840 |
| 6,201,305 B1 | * 3/2001 | Darveaux et al. | 257/779 |
| 6,255,602 B1 | 7/2001 | Evans et al. | 174/262 |

OTHER PUBLICATIONS

Mark J. Kuzawinski, "Wire bond and flip chip: small, fine pitch BGA packages," MicroNews, IBM Microelectronics, $2^{nd}$, Qtr. 2000, vol. 6, No. 2, pp. 23–25. (no month).

D. J. Alcoe et al., "HyperBGA™: a high performance, low stress, laminate ball grid array flip chip carrier," MicroNews, IBM Microelectronics, $2^{nd}$, Qtr. 2000, vol. 6, No. 2, pp. 26–36 (no month).

Darrel R. Frear, "Materials issues in area–array microelectronic packaging," the article appears in the journal JOM, 51 (3) (1999), pp. 22–27. (no month).

* cited by examiner

*Primary Examiner*—Kamand Cuneo
*Assistant Examiner*—Minh N. Tang
(74) *Attorney, Agent, or Firm*—Lumen Intellectual Property Services, Inc.

(57) ABSTRACT

Mass produced organic I.C. chip package designed to permanently package chips are used as MLO space transformers of a probe apparatus having buckling beam probes. The chip carriers have a solder mask layer with holes exposing trace areas from which interface structures are electrochemically grown. Dependent on the amount of grown metal, the interface structure is formed either as a stud bump protruding from the hole or as a flange overlapping the hole and supporting itself on the layer surface surrounding the hole. The structure's contacting surface may be planed for an area contact with the probe end of a buckling beam.

16 Claims, 1 Drawing Sheet

INTERFACE STRUCTURE FOR CONTACTING PROBE BEAMS

FIELD OF INVENTION

This invention relates to space transformers of buckling beam probe cards. More particular, the present invention relates to a method and apparatus for conductively contacting a buckling beam probe with a recessed terminal in a multi layer organic space transformer (MLO space transformer).

BACKGROUND OF INVENTION

A vital part of probe apparatus for testing circuit chips are space transformers that conductively connect the back ends of the buckling beam probe beams with peripheral terminals. Probe apparatus that are used for the testing of chips with ball grid arrays have conventionally a number of parallel probes in tight assembly allowing them to contact the solder balls. In such probe apparatus, the space transformer has to provide the same array of probe end contacts as given by the tested chip's ball grid array. In such a case, the space transformer is conveniently fabricated from the chip carrier, which is ordinarily used to permanently attach the chip after being tested. Chip carriers are part of the chip packaging as is well known to those skilled in the art.

Chip carriers conventionally feature a mask layers or solder masks with holes or material separations that expose only those conductive trace areas, which are dedicated for contacting the solder balls. The mask layer thickness and the hole diameter correspond thereby to the dimension of the individual balls in order to provide sufficient access for the soldering process. Buckling beam probes on the other hand are ideally configured with a profile thickness that is limited by the distance between the probes such that they provide a maximum strength and stiffness. Consequently, the probes have a profile thickness that may exceed the diameter of the material separation in the mask layer.

Probe beams may be slideable assembled within the probe apparatus allowing them to transmit a received testing force onto the contact surfaces of the space transformer. This results in a lateral positioning range within which the probe beam must be able to access the contacting surface of the space transformer. The probe thickness together with the eventual lateral positioning range may be close or even exceed the diameter of the material separation. Consequently, the assembly and/or operation of the probe apparatus may become significantly hampered by the task of bringing and/or securing the probe beams in contact with the contacting surfaces of the space transformer. Therefore, there exists a need for providing a contacting between the probe beams and dedicated contacted surfaces of a space transformer adapted from a chip carrier having a mask layer and material separations. The present invention addresses this need.

During the operational use of the probe apparatus, the beam probes are pressed against the solder balls on the chip under test with a certain force at which surface oxidations on the solder balls are removed. The removing of the surface oxidation is known as scrubbing, which also induces a plastic deformation of the solder balls. Slideable held probe beams transmit the received contacting force via their probe ends onto the contacting surfaces of the space transformer. Chip carriers are configured to withstand mainly the contacting force induced only once and at relatively low levels during the soldering of the solder balls. As a result, the contacting force that is repeatedly induced by the probe ends during the operation of the space transformer may result in a loosening of the conductive traces that provide the contacting surface with the probe ends. The conductive traces may also be otherwise deformed, since the each contacting of the probe beam hammers the probe end onto the conductive trace resulting in an eventual gradual deformation by micro forging the contacting surface. Therefore, there exists a need for an interface structure that is configured to receive the contacting force and the hammering action of the probe end on an ongoing base without altering or destruction of the space transformers configuration. The present invention addresses also this need.

SUMMARY

Mass produced multi-layer organic chip packages designed to permanently package chips are used as MLO space transformers of a probe apparatus having buckling beam probes. The chip packages also called chip carriers are used as preferably provided by the chip manufacturer with a solder mask layer applied on the chip carrier for the soldering of the ball grid arrays of the chips. The mask layer used for the soldering has material separations in a typical form of cylindrical holes in order to expose only dedicated areas of conductive traces beneath the soldering mask for the soldering. In the probe apparatus, probe ends are contacting the exposed trace areas. To provide a more reliable connection of the probe ends with the exposed trace areas, an interface structure is provided that is conductively and permanently connected with the exposed trace area on one end. The interface structure protrudes through the material separations sufficiently to allow a direct contacting with the probe end. The interface structure has a contacting surface in the configuration of either a bump or a planar contacting surface. The planarity of the planar contacting surface may be provided by a sanding process. As a result, the buckling beams may be assembled within a lateral positioning range without impairing a likelihood of missing the material separations, which would interrupt the conductive path towards and/or away from the buckling beams.

The interface structures are deposited in an electrochemical deposition process also known as electro plating or galvanic metal growing. The exposed trace areas are utilized thereby as seeding areas from which the interface structures grow during their fabrication. The growth process conventionally occurs in concentric direction away from the seeding area, which results in a bump initially raising above the surface level of the mask layer. This bump may be utilized as contacting surface for contacting the probe end. The bump may also be planed, for example, with a sanding process. A thereby created planar contacting surface provides a larger contacting area between the interface structure and the beam end.

In the case, where the electrochemical deposition is continued beyond the forming of bumps, the interface structure continues to grow concentrically and unidirectional as soon as the containing walls of the mask layer are overgrown. This results in a mushroom like shape of the interface structure with a flange contacting the outside mask surface surrounding the material separation. The bulky mushroom shape may be sanded down and formed in a flange having an extended planar surface area with a diameter that is bigger than that of the material separation. As a result, buckling beam probes with a section area larger than that of the material separation may be utilized for the probe apparatus.

The lateral positioning range may be compensated by the area extension of the extended planar surface such that the whole end of the buckling beam may contact regardless the position of the buckling beam within the positioning range. The contacting flange provides support during the sanding process, where shear forces threaten to deform and/or break the interface structure off the exposed trace area. The contacting flange also provides mechanical support during the operation of the probe apparatus where the buckling beam probes are mechanically moved towards and pressed onto the contacting surfaces during each test cycle.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
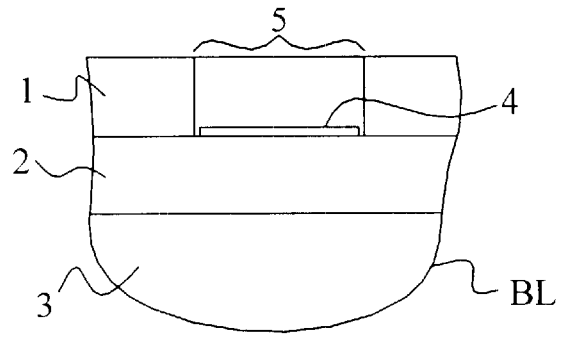
FIG. 1 shows a simplified cut section of a MLO space transformer as provided for fabricating the interface structure.
Figure 2:
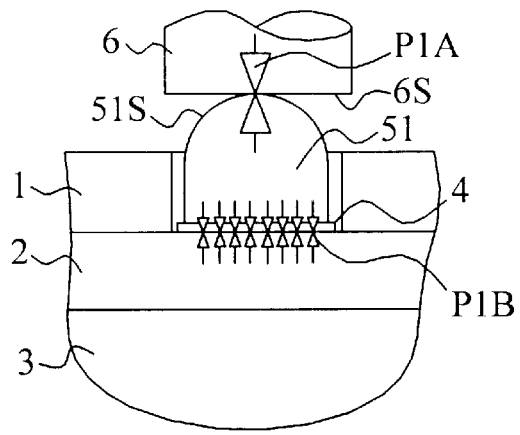
FIG. 2 shows the simplified cut section of FIG. 1 with an interface structure having a contact bump and being contacted by a probe end.
Figure 3:
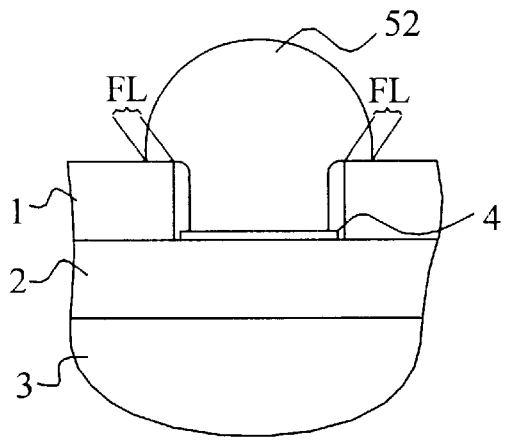
FIG. 3 shows the simplified cut section of FIG. 1 with an interface structure overgrowing the material separation.
Figure 4:
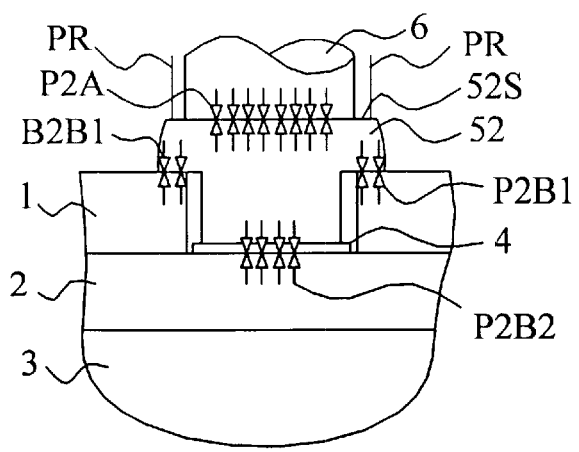
FIG. 4 shows the simplified cut section with the interface structure of FIG. 3 with a planar contacting surface contacting the probe end.

FIG. 1 shows a simplified cut section along the breaking line BL of a multi-layer organic chip package as may be used for a MLO space transformer including the interface structures 51 and 52 (see FIGS. 2–4). Illustrated is the mask layer 1 on top of the conductive trace 2 on top of the MLO bulk structure 3. The mask layer 1, which provides the solder mask as is well known to those skilled in the art has the material separation 5. The material separation 5 may be in the form of a circular hole as conventionally provided by MLO chip packages to contact solder balls of a chip's ball grid array. On top of the conductive trace 2 and within an area defined by the material separation 5 is the exposed trace area, which may feature a terminal 4. The terminal 4 may be copper and/or nickel based and may be plated with nickel and gold.

It is clear to one skilled in the art that the presence of the terminal 4 defines no limitation upon the scope of the invention. Moreover, it is clear that the electrochemical depositing of the interface structures 51, 52 as described above and below may be accomplished on any conductive seeding surface exposed by the material separation 5. The conductive seeding surface may be conductively accessible from a periphery of the MLO space transformer in a fashion suited for the process of electrochemical depositing as is well known to those skilled in the art.

In the preferred embodiment of the invention, the conductive seeding surface is provided by the conductive trace 2. The MLO space transformer preferably adapted from a chip carrier is conventionally configured with a number of terminals 4 spatially connected via a number of conductive traces 2 to peripheral terminals (not shown) on the peripheral surface (not shown) opposing the mask layer 1. Hence, the MLO space transformer is well suited for simultaneous electrochemical deposition of the interface structures 51, 52 since a number of seeding surfaces may easily be simultaneously provided with the galvanic current via the peripheral terminals. Galvanic current flow is adjusted to the configuration of the conductive trace 2 such that the thermal rise within the MLO space transformer during the electrochemical deposition of the interface structures 51, 52 remains below a critical level beyond which the elements of the MLO space transformer may be damaged.

Electrochemical deposited metal conventionally grows unidirectional away from the seeding surface. This unidirectional growth may be altered by changing the flow of the electrolyte or by providing physical insulating obstacles or growth barriers. In the present invention, the walls of the material separation 5 provide such growth barrier forcing the depositing metal to fill the material separation 5 in a concentric fashion. Since the flow of electrolyte is at the highest level in the center of the material separation 5, more material is deposited in the center of the material separation 5 than close to the walls of the material separation 5. For an exemplary diameter of the material separation 5 of approximately 0.0037" and an exemplary thickness of the mask layer 1 of approximately 0.0009", the interface structure 51 may raise approximately 0.001" above the mask layer 1.

FIG. 2 shows an end section of a buckling beam 6 as is well known to those skilled in the art contacting with its probe end surface 6S the contacting surface 51S during the operational use of the probe apparatus incorporating the present invention. As is well known to those skilled in the art, the buckling beam 6 is pressed during a testing sequence against a chip terminal (not shown). In case, the buckling beam 6 is slideable assembled, it transmits the contact force via the probe end surface 6S on the contacting surface 51S, further via the interface structure 51 on the eventual terminal 4 and the conductive trace 2. Due to the essentially point contact between the probe end surface 6S and the contacting surface 51S a first primary contact pressure P1A is created between the probe end surface 6S and the contacting surface 51S. A second primary contact pressure P1B is created between the terminal 4 and the conductive trace 2. The second primary pressure P1B as well as the second secondary residual pressure P2B2 (see FIG. 4) may occur between the interface structure 51, 52 and the conductive trace 2 in case where no terminal 4 is present.

P1A is relative high compared to P1B as is clear to one skilled in the art. P1A may be at a level where the contacting surface 51S may be plastically deformed. As a result, the contacting clearance between the probe end surface 6S and the mask layer 1 may be reduced and the planarity of the probe tips (not shown) may be affected. In addition, P1B may be at a level not suitable for the terminal 4 or the conductive trace 2, which are originally configured to withstand mainly the loads during the assembly of a chip. Consequently, the conductive trace 2 and/or the terminal 4 may be partially or completely loosened. For cases where the contacting force of the buckling beam 6 is at such levels the interface structure 52 may be shaped by continuing the electrochemical metal deposition whereby the metal continues to grow unidirectional once the walls of the material separation 5 are overgrown. An exemplary result of a continued electrochemical metal deposition is illustrated in FIG. 3. There it is shown, that the interface structure 52 may contact the outer mask layer surface and support itself with the flanges FL.

In cases, where the accomplished size of a number of simultaneous grown interface structures 51, 52 varies beyond a threshold that may be compensated by adjusting the length of the individual buckling beams 6, the interface structures 51, 52 may be planed. The planning may be performed, for example by a sanding process as is well known to those skilled in the art. FIG. 4 shows the interface structure 51 after being sanded such that it features a planar contacting surface 52S. The buckling beam probe 6 is contacting the planar contacting surface 52S resulting in a first secondary contact pressure P2A, which is relative low compared to P1A for a given contacting force. The contacting force induced on the interface structure 52 is partially distributed via the flange FL on the mask layer 1 resulting in a partial secondary contact pressure B2B1.

In case, where a shape stability of the interface structure 52 under load is the stringent configuration limitation of the interface structure 52, the area extension of the flange FL is selected in correspondence to a material stiffness of the mask layer 1 on one side and a material stiffness of the interface structure 52 combined with the support stiffness of the terminal 4 and/or the conductive trace 2 on the other side. As a result, all elastic deformations resulting from the contacting force induced by the buckling beam 6 occur uniformly and are predetermined divided into B2B1 and B2B2.

In case, where a maximal mechanical strength of the mask layer 1 is the stringent configuration limitation of the interface structure 52, the area extension of the flange FL is selected in correspondence to the maximal mechanical strength of the mask layer 1.

In case, where a maximal mechanical strength of the terminal 4 and/or the conductive trace 2 is the stringent configuration limitation of the interface structure 52, the area extension of the flange FL is selected in correspondence to a maximal mechanical strength of the terminal 4 and/or the conductive trace 2.

Metals used for the interface structures 51, 52 are preferably gold, nickel or other metals with compatible oxidation characteristics.

The interface structure 51 may also be fabricated by the use of wire bonding techniques as are well known to those skilled in the art. In that case, a wire end with a diameter sufficiently smaller than the diameter of the material separation 5 is guided through the material separation 5, contacted with and bonded to the terminal 4 in a well known friction welding process. Next, the bonded wire is cut off above the surface level of the mask layer 1 and the cut wire end is melted such that the surface tension of the molten wire metal forms a spherical surface on the cut wire end, which is known as reflowing.

The interface structure 51 may also be formed by wire bonding two or more wires with different diameters. Thereby may be an interface structure 51 created that has within the material separation 5 a wire diameter filling the material separation 5. A second wire with an essentially smaller diameter may be friction welded on the cut end of the first wire and reflowed as described in the paragraph above. The use of two different wire diameters allows the build up of the interface structure 51 with higher elevations above the surface level of the mask layer 1. The materials of first and second wire may be selected to their particular function. For example, the first wire may be of a first material having a stiffness necessary to provide sufficient mechanical strength for the interface structure 51. The second wire, for example, may be of a second material having a contact conductivity necessary to provide reliable electrical conductivity with the probe end surface 6S. It is clear to one skilled in the art, that materials for the first and second wire may be selected in accordance with any other characteristics required for a reliable function of the interface structure 51.

The interface structure 52 may be formed by wire bonding by using a first wire with a diameter corresponding to the diameter of the material separation 5 and being cut off at the surface level of the mask layer 1. The second wire may have a second diameter exceeding the diameter of the material separation 5. The friction welding may result in a slight recess of a welding plane between the first and second wire such that flange area FL is pressing against the mask layer 1. By adjusting the height at which the first wire is cut above the surface level of the mask layer 1, the contact pressure in the flange area FL may be adjusted. The second wire may be reflowed and eventually sanded as described in the above.

It is clear to one skilled in the art that material selections and fabrication selections may be combined from the above described to provide interface structures 51, 52 best suited for a given condition of used chip carriers and probe beams. For example, an interface structure 51 or 52 may be initially formed by using electro chemical deposition thus avoiding mechanical stress and/or thermal rise of the terminal 4 or the trace 2. The wire bonding technique may be used to attach additional wire structures as described in the two paragraphs above on top of the interface structures 51 or 52. To the contrary, the electro chemical deposition may be used to plate the interface structures 51, 52 previously created with wire bonding techniques. The plating may be used to provide thin surface layers of expensive non-oxidizing layers like for instance gold.

Accordingly, the scope of the invention described in the specification above is set forth by the following claims and their legal equivalent.

What is claimed is:

1. An interface structure of a probe apparatus, said interface structure protruding through material separations of a mask layer deposited on a trace-carrying surface of a MLO space transformer, said interface structure being conductively and rigid connected with a conductive trace positioned on said trace carrying surface, and said interface structure having a support flange mechanically supporting said interface structure on an outer surface of said mask layer, wherein said support flange has an area extension selected in correspondence with a configuration, wherein said configuration is selected from the group consisting of a maximal mechanical strength of said mask layer, a maximal mechanical strength of said conductive trace, and a material stiffness of said mask layer on one side and a material stiffness of said interface structure combined with a support stiffness of said conductive trace on the other side.

2. The interface structure of claim 1 having an electrochemically grown structure.

3. The interface structure of claim 2, wherein said electrochemically grown structure includes gold.

4. The interface structure of claim 2, wherein said electrochemically grown structure includes nickel.

5. The interface structure of claim 1 having a planar contacting surface corresponding to a contacting probe end.

6. The interface structure of claim 5, wherein said planar contacting surface is a sanded surface.

7. The interface structure of claim 5, wherein said planar contacting surface has an area extension that corresponds to a probe end area plus a lateral position range of said contacting probe end.

8. The interface structure of claim 1 having a stud bump for contacting a contacting probe end.

9. A Method for providing electrical contact between a recessed trace of a MLO space transformer and a buckling beam end of a probe apparatus, said method comprising the steps of:

a. providing a prefabricated MLO space transformer having a mask layer deposited on a trace-carrying surface of said MLO space transformer, said mask layer having a material separation exposing said recessed trace;
b. depositing an electrical conductive structure protruding through said material separation;
c. forming a contacting surface on said electrical conductive structure for contacting a probe end; and
d. forming a support flange mechanically supporting said interface structure on an outer surface of said mask layer, wherein said support flange has an area extension selected in correspondence to a configuration, wherein said configuration is selected from the group consisting of a maximal mechanical strength of said mask layer, a maximal mechanical strength of said conductive trace, and a material stiffness of said mask layer on one side and a material stiffness of said interface structure combined with a support stiffness of said conductive trace on the other side.

10. The method of claim 9, wherein said depositing is an electrochemical depositing.

11. The method of claim 10, wherein said electrochemical depositing includes gold.

12. The method of claim 10, wherein said electrochemical depositing includes nickel.

13. The method of claim 9, wherein said contacting surface is a planar contacting surface corresponding to said contacting probe end.

14. The method of claim 13, wherein said planar contacting surface is formed by sanding.

15. The method of claim 13, wherein said planar contacting surface has an area extension that corresponds to a probe end area plus a lateral position range of said contacting probe end.

16. The method of claim 9, wherein said contacting surface is a stud bump for contacting a contacting probe end.

* * * * *